United States Patent
Amherd-Hidalgo et al.

(10) Patent No.: US 12,012,651 B2
(45) Date of Patent: Jun. 18, 2024

(54) CORROSION-INHIBITING PROTECTION FOR WATCH MAGNETS, IN PARTICULAR NEODYMIUM-IRON-BORON MAGNETS

(71) Applicant: Comadur SA, Le Locle (CH)

(72) Inventors: Alexandra Amherd-Hidalgo, Neuchatel (CH); Alexis Boulmay, Morteau (FR); Pierry Vuille, Les Emibois (CH)

(73) Assignee: Comadur SA, Le Locle (CH)

( * ) Notice: Subject to any disclaimer, the term of this patent is extended or adjusted under 35 U.S.C. 154(b) by 250 days.

(21) Appl. No.: 17/449,675

(22) Filed: Oct. 1, 2021

(65) Prior Publication Data

US 2022/0154327 A1 May 19, 2022

(30) Foreign Application Priority Data

Nov. 13, 2020 (EP) ..................................... 20207433

(51) Int. Cl.
| | |
|---|---|
| *C23C 14/48* | (2006.01) |
| *C22C 38/00* | (2006.01) |
| *C23C 14/02* | (2006.01) |
| *C23C 14/06* | (2006.01) |
| *C23C 14/08* | (2006.01) |
| *G04D 3/00* | (2006.01) |
| *H01F 1/057* | (2006.01) |
| *H01F 41/02* | (2006.01) |

(52) U.S. Cl.
CPC ............ *C23C 14/48* (2013.01); *C22C 38/005* (2013.01); *C23C 14/021* (2013.01); *C23C 14/028* (2013.01); *C23C 14/0641* (2013.01); *C23C 14/085* (2013.01); *G04D 3/0097* (2013.01); *H01F 1/057* (2013.01); *H01F 41/026* (2013.01); *C22C 2202/02* (2013.01)

(58) Field of Classification Search
CPC ...................................................... C23C 14/48
See application file for complete search history.

(56) References Cited

FOREIGN PATENT DOCUMENTS

| | | | |
|---|---|---|---|
| CN | 101239387 A | * | 8/2008 |
| CN | 102864430 A | | 1/2013 |
| CN | 102864432 A | | 1/2013 |
| CN | 106756857 A | | 5/2017 |
| CN | 106756859 A | * | 5/2017 |
| CN | 106756859 A | | 5/2017 |
| CN | 111441017 A | * | 7/2020 |
| CN | 111441017 A | | 7/2020 |
| FR | 2 768 551 A1 | | 3/1999 |
| JP | 61-39507 A | | 2/1986 |
| JP | 4-254313 A | | 9/1992 |
| WO | WO 2020/071446 A1 | | 4/2020 |

OTHER PUBLICATIONS

Espacenet machine translation of CN-101239387-A retrieved on Sep. 4, 2023 (Year: 2008).*
Espacenet machine translation of CN-106756859-A retrieved on Sep. 4, 2023 (Year: 2017).*
Espacenet machine translation of CN-111441017-A retrieved on Sep. 4, 2023 (Year: 2020).*
Merriam-Webster definition of "impervious" retrieved from <https://www.merriam-webster.com/dictionary/impervious> on Feb. 24, 2024 (Year: 2024).*
European Search Report issued Apr. 16, 2021 in European Application 20207433.2 filed on Nov. 13, 2020, citing documents AO-AQ therein, 3 pages (with English Translation of Categories of Cited Documents).
Japanese Office Action issued on Nov. 8, 2022 in Japanese Patent Application No. 2021-164485 (with English translation), citing references 15-20 therein, 8 pages.

* cited by examiner

*Primary Examiner* — Jophy S. Koshy
*Assistant Examiner* — Joshua S Carpenter
(74) *Attorney, Agent, or Firm* — Oblon, McClelland, Maier & Neustadt, L.L.P.

(57) ABSTRACT

A method for protecting a neodymium-iron-boron watch magnet against corrosion is provided. The method includes a sandblasting treatment of the watch magnet surface following by an ion implantation in an oxygen plasma or a nitrogen plasma to obtain an impervious surface layer with all of the surface bonds saturated by the implanted ions acting as a barrier against oxidation and preventing corrosion of the watch magnet in a humid environment, under the usual conditions for wearing watches.

10 Claims, No Drawings

CORROSION-INHIBITING PROTECTION FOR WATCH MAGNETS, IN PARTICULAR NEODYMIUM-IRON-BORON MAGNETS

CROSS-REFERENCE TO RELATED APPLICATION

This application claims priority to European Patent Application No. 20207433.2 filed on Nov. 13, 2020, the entire disclosure of which is hereby incorporated herein by reference.

FIELD OF THE INVENTION

The invention relates to a method for protecting a neodymium-iron-boron watch magnet against corrosion, characterised in that a neodymium-iron-boron magnet is provided, and that a surface preparation operation is carried out on said magnet, before subjecting it to an ion implantation treatment, in order to create an impervious surface layer acting as a barrier against oxidation with all of the surface bonds saturated by the implanted ions, in order to prevent the corrosion of said magnet in a humid environment, under the usual conditions for wearing watches.

The invention relates to the field of the protection of timepieces against corrosion, in particular watches, which can be subjected to very large variations in temperature and humidity under the conditions of use for which they are guaranteed, on the Earth's surface for watches intended for the general public, but also for specific users, in the space and underwater fields.

BACKGROUND OF THE INVENTION

Magnets are susceptible to corrosion, and the effective protection thereof is difficult to procure.

However, the layer deposited must be inexpensive, in particular to apply, have good resistance to the corrosion caused by humidity, not diminish the magnetic properties, and show a certain degree of mechanical strength. These restrictions are still poorly overcome by known solutions, which consist of depositing Al2O3, SiO2, epoxy or nickel layers on the surface thereof.

The prior art document FR2768551 describes a flat magnet including a coating layer allowing the magnetic properties of the magnet to be enhanced. The document provides for the addition of additives to the coating in order to improve the mechanical properties or corrosion resistance thereof.

SUMMARY OF THE INVENTION

The invention proposes producing a corrosion-inhibiting protective layer on watch magnets, in particular on NdFeB magnets, by ion implantation.

For this purpose, the invention relates to a method for protecting a watch magnet against corrosion according to the attached claims 1.

DETAILED DESCRIPTION OF THE PREFERRED EMBODIMENTS

The invention relates to a method for protecting a neodymium-iron-boron watch magnet against corrosion, characterised in that a neodymium-iron-boron magnet is provided, and that a surface preparation operation is carried out on said magnet, before subjecting it to an ion implantation treatment, in order to create an impervious surface layer acting as a barrier against oxidation with all of the surface bonds saturated by the implanted ions, in order to prevent the corrosion of said magnet in a humid environment, under the usual conditions for wearing watches.

Ion implantation technology is used to create a barrier against natural oxidation by saturating the surface layer, in particular the oxide or nitride layer in the case of ion implantation treatment in oxygen or nitrogen respectively.

This saturation layer is created by accelerating the multicharged ions of an O2, N2, or other plasma, with a potential difference comprised between 10 kV and 40 kV. The ions are thus densified on the surface, at different depths (depending on the charge of the ion), creating a barrier against oxidation at the outermost surface, whereby all of the surface bonds are saturated by the implanted ions.

More particularly, to implement the method according to the invention, a neodymium-iron-boron magnet is provided, containing 22 wt % to 24 wt % neodymium, 65 wt % to 67 wt % iron, and 0.1 wt % to 2 wt % boron, and the magnet undergoes a surface preparation operation, before being subjected to an ion implantation treatment, in order to create an impervious oxidised or nitrided surface layer, to prevent the magnet from becoming corroded in a humid environment, under the usual conditions for wearing watches.

The composition of the magnet described hereinabove includes additives and/or traces of impurities, for example oxides.

More particularly, an oxidising ion implantation treatment is carried out, in oxygen, with a voltage of 10 kV to 40 kV.

More particularly, an oxidising ion implantation treatment is carried out, in oxygen, with a voltage of 24 kV to 26 kV, a beam current of 5 mA to 7 mA, and a dose of $20.\ 10^{16}$ to $30.\ 10^{16}$ ions per square centimetre.

More particularly, a nitriding ion implantation treatment is carried out, in nitrogen, with a voltage of 10 kV to 40 kV.

More particularly, a nitriding ion implantation treatment is carried out, in nitrogen, with a voltage of 24 kV to 26 kV, a beam current of 5 mA to 7 mA, and a dose of $20.\ 10^{16}$ to $30.\ 10^{16}$ ions per square centimetre.

More particularly, the surface preparation operation is carried out on the magnet by sandblasting followed by rinsing with alcohol and air drying.

More particularly, sand blasting is carried out using alumina particles with a particle size of 200 mesh to 240 mesh, at a pressure of 1.4 to 1.8 bar, and with a distance of 13 mm to 17 mm between the flow and the surface to be sand blasted.

More particularly, the method is applied to a magnet having a thickness of less than or equal to 1.0 mm, and a largest dimension of less than or equal to 8.0 mm.

More particularly, the method is applied to a magnet having a thickness of less than or equal to 0.6 mm, and a largest dimension of less than or equal to 5.0 mm.

More particularly, the method is applied to a magnet that is perforated with a through-hole, having a largest dimension comprised between 0.2 mm and 3.0 mm.

In a non-limiting horological application, a toroidal or cylindrical magnet made of NdFeB, the outside diameter whereof has dimensions in the order of 0.9 mm to 5.0 mm, with a through-hole having an inside diameter in the order of 0.21 mm to 3.0 mm, and a thickness in the order of 0.15 mm to 0.55 mm, is subjected to ion implantation treatment to create an impervious oxidised or nitrided layer, which prevents the magnet from becoming corroded in humid environments.

Magnets treated with this technique are visually inspected before and after an accelerated ageing test (7 days at 60 degrees Celsius and 90% relative humidity).

The method is highly effective for a neodymium-iron-boron magnet containing 23 wt % neodymium, 66 wt % iron, and 1 wt % boron.

Visual inspection of magnets of the same type, but without treatment, shows the red corrosion that is typical of NdFeB material. However, when the ion implantation treatment in oxygen is carried out according to the invention, this corrosion does not occur.

The ion implantation treatment in oxygen creates an oxidised barrier on the surface of the magnet. The surface changes to a state wherein the rate of corrosion is significantly slowed down by the presence of an artificial passive surface condition, compared to what it would be without this oxide layer.

Nitriding by ion implantation allows nitrogen to be incorporated into the surface of the magnet. The nitrogen reacts with the iron by diffusing onto the surface layers of the magnet. A layer of iron nitrides is created on the surface, which prevents oxygen from penetrating inside the parts.

The results show that the protection afforded by the implantation of oxygen or nitrogen ions can protect the NdFeB material against corrosion (60° Celsius and 90% relative humidity for 7 days). The two layers obtained with these two alternative embodiments of the method according to the invention each provide a homogeneous, stable and dense protection, which procures effective protection against corrosion.

The invention thus offers significant advantages:
- high resistance to corrosion;
- innovative technology that is eco-friendly since it consumes a small amount of gas consumption and generates few or no emissions;
- no risk of delamination, since the treatment is carried out in the material itself, not covering the surface thereof;
- method that is repeatable and easy to adjust;
- production of a protective layer with negligible magnetic losses;
- production of a protective layer with adequate mechanical strength.

The invention claimed is:

1. A method for protecting a watch magnet against corrosion, comprising:
    preparing a surface of the watch magnet with a sandblasting operation;
    subjecting the sandblasted surface of the watch magnet to an ion implantation treatment in a plasma selected from the group consisting of an oxygen plasma and a nitrogen plasma, to obtain an outermost surface of the watch magnet having all surface bonds saturated by oxygen ions or nitrogen ions;
    wherein
    the watch magnet is a neodymium-iron-boron magnet is containing 22 wt % to 24 wt % neodymium, 65 wt % to 67 wt % iron, and 0.1 wt % to 2 wt % boron, and
    the outermost surface of the watch magnet having all surface bonds saturated by oxygen ions or nitrogen ions is an impervious oxidized or nitrided surface layer.

2. The method according to claim 1, wherein the ion implantation treatment is carried out in oxygen with a voltage of 10 kV to 40 kV, and the plasma consists of oxygen plasma.

3. The method according to claim 1, wherein the ion implantation treatment is carried out in nitrogen with a voltage of 10 kV to 40 kV, and the plasma consists of nitrogen plasma.

4. The method according to claim 1, further comprising rinsing the watch magnet with alcohol and air drying the watch magnet after the sandblasting operation.

5. The method according to claim 1, wherein a thickness of the watch magnet is less than or equal to 1.0 mm, and a largest dimension of the watch magnet is less than or equal to 8.0 mm.

6. The method according to claim 2, wherein the voltage is from 24 kV to 26 kV, a beam current is from 5 mA to 7 mA, and a dose of ions per square centimetre is from $20 \times 10^{16}$ to $30 \times 10^{16}$.

7. The method according to claim 3, wherein the voltage is from 24 kV to 26 kV, a beam current is from 5 mA to 7 mA, and a dose of ions per square centimetre is from $20 \times 10^{16}$ to $30 \times 10^{16}$.

8. The method according to claim 1, wherein the sandblasting operation is carried out using alumina particles with a particle size of 200 mesh to 240 mesh, at a pressure of 1.4 to 1.8 bar, and with a distance of 13 mm to 17 mm between the flow and the surface of the watch magnet to be sandblasted.

9. The method according to claim 5, wherein the thickness of the watch magnet is less than or equal to 0.6 mm, and the largest dimension of the watch magnet is less than or equal to 5.0 mm.

10. The method according to claim 5, wherein the watch magnet is perforated with a through-hole having a largest dimension between 0.2 mm and 3.0 mm.

* * * * *